United States Patent [19]

Levy

[11] Patent Number: 4,668,354
[45] Date of Patent: May 26, 1987

[54] ELECTROCATALYTIC DEPOSITION OF METALS IN SOLID POLYMERIC MATRICES

[75] Inventor: Moshe Levy, Claymont, Del.

[73] Assignee: E. I. Du Pont de Nemours and Company, Wilmington, Del.

[21] Appl. No.: 901,770

[22] Filed: Aug. 29, 1986

[51] Int. Cl.$^4$ ............................................. C25C 1/00
[52] U.S. Cl. ................................................. 204/130
[58] Field of Search ........................... 204/130, 20, 22

[56] References Cited

U.S. PATENT DOCUMENTS 4,512,855  4/1985  Mazur ................................... 204/22

OTHER PUBLICATIONS

Pickup et al., in *J. Electrochem. Soc.*, 130, 2205 (1983).

*Primary Examiner*—Howard S. Williams
*Attorney, Agent, or Firm*—James A. Costello

[57] ABSTRACT

A process for depositing metal in the form of an interlayer within a solid matrix. The process is characterized in the use of electroactive transfer agents to carry electrons from the cathode to the desired locus within the matrix where the metal cation ($M^{n+}$) is reduced to its zero-valent state. Also disclosed are composites of metallic-interlayer-containing matrices.

18 Claims, 2 Drawing Figures

ELECTROCATALYTIC DEPOSITION OF METALS IN SOLID POLYMERIC MATRICES

BACKGROUND OF THE INVENTION

Process for the deposition of a broad range of metals in solid matrices. Preferred matrices are swellable organic polymers which, in their swelled condition, form an appropriate environment for reduction of metal ions ($M^{n+}$) to their zero-valent state by electron-carrying transfer agents.

STATE OF THE ART

There exist in the art many different chemical or physical methods by which a zero-valent metal can be added to a polymeric film. Among these, some are capable of producing a thin continuous coating at a surface of the polymer, for example, metal vapor deposition or electroless plating. Other processes, such as silver halide photography and certain forms of chemical deposition, produce metal particles embedded within the polymer film. However, these particles are generally dispersed to such a degree that they lack the characteristic electrical or optical properties of a continuous metal layer. The present invention concerns a process capable of producing, in a single step, a thin layer of metal as an interlayer within a solid matrix. By means of this process, it is possible to control the thickness of the layer, its density, and its position within the matrix. Most notably, this layer can possess sufficient continuity and planarity to exhibit the electrical and optical characteristics of the bulk metal.

Pickup et al., in *J. Electrochem. Soc.*, 130, 2205 (1983), disclose electrodeposition of metals (Cu, Ag, Co and Ni) from solution onto electrodes coated with the electrochemically active polymer poly[Ru(bpy)$_2$(vpy)$_2$]$^{n+}$. At potentials sufficiently negative to reduce the polymer to Ru(I) or Ru(O) these authors report that the metal ions, for example, $Cu^{+n}$, $Ag^+$, are reduced by the polymer to form particles on the surface of the polymer facing the solution. However, the authors did not disclose metal deposition within the polymer.

U.S. Pat. No. 4,512,855 discloses a metal interlayer deposition (MID) process. The process involves reduction of metal ions, diffusing from one surface of a polymer film, by electrons supplied via redox reactions of the polymer, the electrons being supplied from the opposite surface of the film. In the disclosed process, it is necessary that the polymer be electrochemically active in the sense that it is capable of undergoing reversible redox reactions at appropriate potentials to reduce the metal to its zero-valent state. The MID process can produce metal interlayers of sufficient density to be electrically conductive and with sufficiently smooth and sharply defined surfaces to be optically reflective.

The process of this invention produces the desirable features attainable by the process of U.S. Pat. No. 4,512,855 without the necessity that the matrix be electrochemically active. It is necessary only that the matrix be permeable to the metal ions and the transfer agent and, when the matrix is a polymer, that the polymer be swellable to allow an appropriate environment in which selected transfer agents can effect electron transport between the cathode and the metal. Use of electron transfer agents adds flexibility to metal deposition in that all swellable polymers (the vast majority of all polymers) are now candidates for electrochemical interlayer deposition regardless of polymer electroactivity or lack thereof.

The process of this invention can be controlled so that the position of the metal layer is a selectable distance from the surface of the matrix. The process is characterized in that the transport of electrons and ions is governed by diffusion principles. Furthermore, the process is flexible in that it provides a dense, well-resolved metal layer under steady state conditions in which ion and electron transport rates are equal and reaction rates are fast.

SUMMARY OF THE INVENTION

This invention concerns, broadly, a process for controlled deposition of metal in a matrix, comprising the steps of:
  (i) providing an environment within the matrix for electron transfer by an electron transfer agent,
  (ii) providing the matrix with an electrical circuit source of electrons for transfer within the matrix by the electron transfer agent,
  (iii) contacting the matrix with an electron transfer agent to carry the electrons of step (ii) within the matrix,
  (iv) contacting the matrix with metal ions reducible to zero-valent metal upon contact with electrons, and
  (v) reducing the metal ions of step (iv) by contacting them with the electron-carrying electron transfer agent of step (iii).

In a preferred embodiment, this invention concerns a process for controlled deposition of metal in a swellable organic polymer, comprising the steps of:
  (i) swelling the polymer to provide an environment within the polymer for electron transfer by an electron transfer agent,
  (ii) providing the swelled polymer with an electrical circuit source of electrons for transfer within the polymer by the electron transfer agent,
  (iii) contacting the swelled polymer with an electron transfer agent to carry the electrons of step (ii) within the polymer.
  (iv) contacting the swelled polymer with metal ions reducible to zero-valent metal upon contact with electrons, and
  (v) reducing the metal ions of step (iv) by contacting them with the electron-carrying electron transfer agent of step (iii).

Control of location and configuration of the metal deposition depends on several factors such as identity of the particular metal to be deposited, concentration of the metal ions, identity and concentration of the electron transfer agent, type of matrix, degree of polymer swelling, and applied potential. By control of these factors, a metal interlayer can be deposited anywhere within the matrix. By "interlayer" is meant a discrete laminar region embedded at least partially within, and substantially parallel to, the matrix, the density of the metal within said region being greater than the density of metal in the remaining regions of the matrix.

As will be appreciated by one skilled in the art, there is an important relationship between the electron transfer agent, metal ions and electron source, from the standpoint of their electrochemical potentials. The transfer agent must be reducible by the electron source, and in turn must be capable of reducing the metal ions to metal in the zero-valent state.

This invention also concerns a composite of matrices, each matrix layer being of similar or disparate material and each layer having an interlayer of the same or different metal deposited within it prior to formation of the multilayer composite (sandwich). See the section entitled "The Matrix", post, for a discussion of contemplated matrices. The composite can also comprise matrix shapes of various geometries whose individual components have been produced according to the teachings of this invention.

DETAILS OF THE INVENTION

The Process

Figure 1:
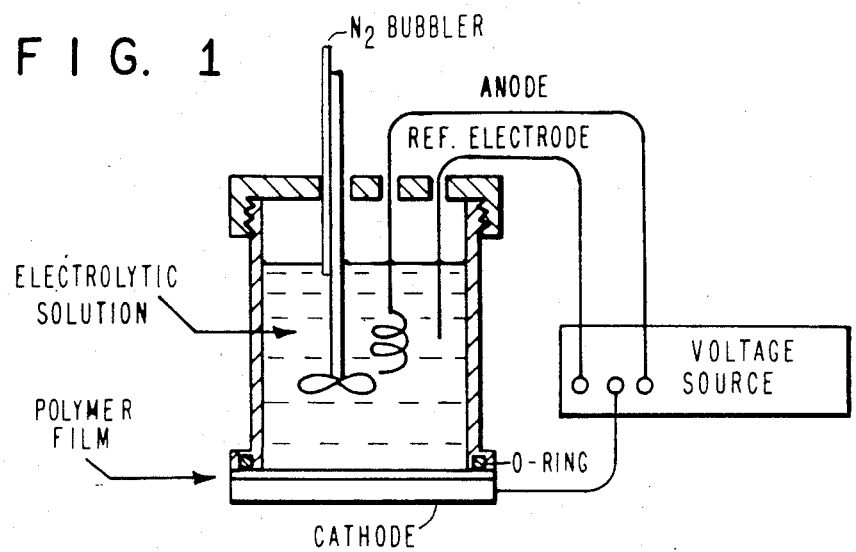
FIG. 1 is a schematic representation of one type of apparatus that can be used to carry out the process of this invention employing an electrochemical cell to provide electrons.
Figure 2:
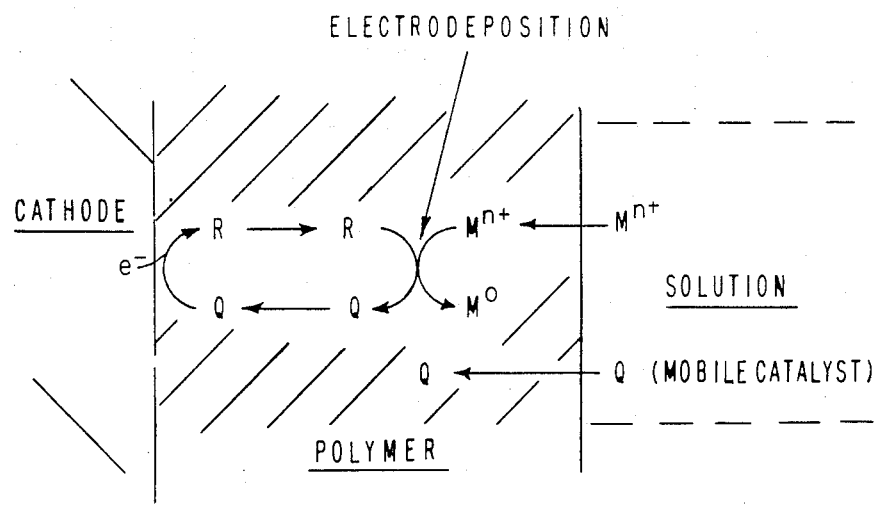
FIG. 2 is a schematic representation of electron transfer within the matrix to affect reduction of the metal ion to its zero-valent state. The matrix is contacted with metal ions ($M^{n+}$) from an electrolytic solution. The matrix can be contacted with the electroactive transfer agent (Q) during swelling and/or under steady state operating conditions wherein the matrix is in contact with the electrolytic solution containing Q. Q accepts electrons from the cathode and, as R, transports the electrons to the locus selected for metal deposition where $M^{n+}$ is reduced to and deposits as $M°$.

The present invention comprises reaction of metal ions diffusing from a solution in contact with one side of the matrix, with reducing agent diffusing from the other side which is in electrical contact with an electrode surface. The reducing agent (R) is formed in situ at the electrode surface by transfer of an electron to an electrocatalytic transfer agent (Q) added to the solution. Thus, R can be electrochemically or photoelectrochemically generated at any desired area of the matrix. The flux of R can be controlled by the applied voltage or current and concentration of Q as well as by other factors that influence the mobility of small molecules and ions in the matrix.

The position of the metal layer is determined by the point of encounter of two fluxes: the metal ions from the solution side, and the reduced transfer agent, from the electrode side. The fluxes are defined generally in accordance with Fick's law, although under some circumstances effects of electric field migration may also be significant. They will depend on the diffusion coefficients, the concentrations of salt and reagent, the nature of the solvent and matrix and the applied potential. Other variables include the temperature and, when the matrix is a polymer, the microstructure of the polymer and its glass transition temperature.

Matrices, transfer agents, metals, solvents, and the like should obviously be selected so that no reaction takes place that would interfere with the process of this invention. Where reducing agents react with oxygen, the process should be run under an inert atmosphere. The matrices are firmly affixed, e.g., by deposition, tight bonding or mechanical holding, to the electrode to maintain good electrical contact. Alternatively, a mercury electrode can be used in contact with the matrix. When the matrix is a polymer, the degree of swelling can be controlled by using mixtures of solvents and/or by raising the temperature. Another way to control the swelling is to adjust the casting and drying conditions of the film. The transfer agent must have a reversible oxidation reduction potential high enough to react with the cation to be deposited. Moreover, the reduction potentials cannot be too high, as irreversible reactions with the polymer may then occur.

Representative swellable polymers contemplated for use in the process of this invention will be set forth in more detail hereafter. It is noted that certain highly crystalline polymers might not work as well as amorphous polymers or amorphous forms of the same polymer. Such impractical polymers include polytetrafluoroethylene homopolymer, certain highly oriented and/or highly crystalline polyesters, and linear high density polyethylene.

Any device can be employed as the electron source so long as it can maintain a constant potential or current. The best device is a potentiostat; however, under proper conditions, a pack of batteries can be used. In an embodiment employing an electrochemical circuit to provide the electrons, the cathode consists of an electrically-conductive substrate. The substrate can be either a homogeneous metal, semimetal, or semiconductor (stainless steel, pyrolytic carbon, or silicon, for example) or an insulating support coated with a thin layer of conductive material, such as glass coated with a thin layer of tin oxide or chromium. In the latter case, the conductive layer may cover the entire surface of the insulating support or it may consist of a two-dimensional image such as lines, separated by insulating regions.

The voltage and/or current can be further regulated by a device such as a photoconductive layer whose properties depend upon the intensity of light impinging on it. By this means, patterned interlayers can be grown. The voltage can also be applied by using a light source, provided the electrode is a photovoltaic one. Thus, a pattern can be projected through a screen. The intensity of the light will then define the voltage at different spots on the electrode.

In principle, electrons also can be supplied from a chemical source. For example, a mirror of sodium metal can be deposited on the electrode followed by the polymeric film. Upon introduction of the solution, the catalytic reagent will diffuse through the polymer film to the sodium mirror and react with it, resulting in the reduced form. The reduced species will then diffuse back into the film and react with the metal to be deposited.

The Matrix

Preferred matrices are film-forming polymers that can be swelled in a solvent or mixture of solvents to accommodate an electron transfer agent. Contemplated polymers include, but are not limited to, the following: polyolefins including polyethylene, polypropylene, polybutadiene; polyolefin rubbers; polyionomers; polyacrylates including polymethylmethacrylate, polyhydroxyethylmethacrylate; polyacrylonitrile, poly(acrylonitrile, butadiene, styrene); polystyrene; polyvinylacetate; polyvinyl alcohol; polyacrylamide; vinyl polymers including polyvinylchloride (PVC) and fluoride, polyvinylidene chloride and fluoride; polyphenyleneoxide; polyimides; polyamides; polyesters; polysulfones; polycarbonates; polyurethanes; polysiloxanes; polyethyleneoxide; natural polymers including cellulose and cellulose esters; fluoropolymers including copolymers of tetrafluoroethylene; swellable inorganic polymers including polyphosphates; organometallic polymers, sol-gel ceramics; polyelectrolytes; ion exchange polymers; proteins; dextrin, starch; agar; agarose, and the like. This invention also contemplates matrices of microporous materials such as ceramics, zeolites and the like which, although they may not swell, provide an appropriate environment for metal reduction/deposition. Included within the scope of this invention are all homopolymers, copolymers, prepolymers, gels, blends, mixtures, block and graft copolymers, ionomers, polymer salts, microporous materials and the like that comprise one or more of the recited matrix materials.

The swelling of the polymer is preferentially in the direction perpendicular to the electrode surface. This can be achieved by proper deposition on the electrode surface with strong adhesion between the electrode and the film. Otherwise, the film may become partially detached from the electrode and non-uniform deposition may result. In cases where the solvent dissolves the film, a non-solvent can be added to adjust the degree of swelling. The solvent should have a high enough polarity to dissolve the supporting electrolyte, the metal salt and the catalytic reagent.

The matrix may be electroactive itself, as detailed in U.S. Pat. No. 4,512,855. Nevertheless, employment of a suitable transfer agent, per this invention, may be advantageous. Use of a soluble transfer agent can enable changing of the period of time necessary for interlayer production by change of the transfer agent concentration. The soluble transfer agent employed may not require the reducing potential otherwise necessary for matrix reduction.

The Metals

The metals include all those having reduction potentials consistent with the teachings of this invention respecting electron transfer agents and electron generation. Contemplated metals include Ag, Cu, Au, Cd, Hg, Cr, Co, Ni, Pd, Pt, Pb, Sn, Fe, Li, Na, K and Mg.

Electron Transfer Agents

Contemplated transfer agents are those which are soluble in the electrolyte solvent and which have reduction potentials high enough to reduce the metal ion to zero-valent metal. A number of compounds used in the photographic field can be used provided they are added in the oxidized form. The reduced species can be in the ionic form or in the protonated form depending on whether one is working in an aprotic or in a protic medium. The transfer agents can be selected from quinones, quinone derivatives, diketones, aromatic compounds, nitro compounds, imides, some pyridinium, quinolinium and acrydinium salts and combinations thereof so long as redox potentials are compatible and reductions are reversible. The redox potential can vary considerably but it has to be kept below the limit of irreversible reduction of the solvent or the polymer itself. Contemplated transfer agents, selected depending on the reduction potential of the metal to be deposited, include the following:

| Transfer Agents | Redox Potential* V(vs SCE) |
|---|---|
| benzoquinone | 0.54 |
| chlorobenzoquinone | 0.46 |
| dichlorobenzoquinone | 0.18 |
| dihydroxybenzoquinone | 0.57 |
| tetrachlorobenzoquinone | −0.02 |
| tetrafluorobenzoquinone | 0.04 |
| tetrahydroxybenzoquinone | 0.32 |
| dicyanobenzoquinone | −0.31 |

-continued

| Transfer Agents | Redox Potential* V(vs SCE) |
|---|---|
| dicyanochlorobenzoquinone | −0.41 |
| 1,4-naphthoquinone | 0.60 |
| methylnaphthoquinone | 0.69 |
| phenanthraquinone | 0.62 |
| anthraquinone | 0.83 |
| aminoanthraquinone | 0.97 |
| dimethylanthroquinone | 1.08 |
| acetophenone | 1.94 |
| benzalacetone | 1.48 |
| benzil | 1.04 |
| benzophenone | 1.21 |
| fluorenone | 0.87 |
| xanthone | 1.65 |

*Mann et al., Electrochemical Reactions In Non-Aqueous Systems, Marcel Dekker, N.Y., 1970.

Representative combinations of polymer/solvent/metal/transfer agent that can be used in the process of this invention are:

| Polymer | Solvent | Metal | Transfer Agent* |
|---|---|---|---|
| Polyvinylchloride | acrylonitrile/dimethylformamide | Ag, Cu, Hg | Benzoquinone (BQ) |
| Polyvinylidenefluoride | dimethylformamide | Ag, Hg | Benzoquinone (BQ) |
| Polyvinylfluoride | dimethylformamide | Ag | Benzoquinone (BQ) |
| Cellulose | water/alcohol | Ag, Hg, Cu | Benzoquinone (BQ) |

*Each of the following quinones can be substituted for BQ: naphthaquinone, anthraquinone, anthrone, benzil, fluorenone.

Utility And Control Of Layer Position

The principles of this invention allow control of the location of metal deposition within the matrix. The metal interlayer is composed of spherical microparticles of metal having diameters of about 500 angstroms although some larger and some smaller particles are also present. For most practical applications, the microparticles are present in an amount of at least about 18%, by volume. In particularly preferred embodiments of the invention, the particles can be packed to a density which is as high as 75 percent of the density of the bulk metal. In a preferred embodiment, the thickness of the polymeric film is 2 to 100 μm and the thickness of the interlayer is 0.05 to 10 μm (500 to 10,000 angstroms).

The parameters can be varied during the deposition process to obtain complex metal patterns, such as multiple layers of varying thickness, density, and position within the matrix. These features of the invention provide utility for the manufacture of electrically-conductive circuit patterns or metallized images. Patterned interlayers can be formed by employing patterned cathodes or by employing photosensitive cathodes in conjunction with photo development techniques.

Other utilities are as optically-sensitive films. For example, films containing interlayers composed of diffusely distributed microparticles can be optically homogeneous, i.e., the particles do not scatter light because they are much smaller than the wavelength of the light, but the optical density of the films can be very high, greater than 4.0, due to absorption of light by the metal, rendering them useful as optical filters. In another embodiment, the interlayer can be prepared with a high density of metal such that the metal forms an electrically continuous phase which is capable of carrying an electrical current. The electrically-conductive interlayer can be prepared with a sharply-defined smooth interface with the surrounding polymer such that the interface is optically reflective as a mirror. The electrically-conductive, optically-reflective interlayers, because they are primarily internal to the matrix, are resistant to abrasion. Advantages are also evident over laminated structures prepared, for example, by a stepwise procedure, because the interface between the interlayer and the matrix can be maintained optically flat and shows no tendency to delaminate. Articles and composites made by the process of this invention possess utility for reflective, electrically-conductive, abrasion-resistant coatings which can be used for electrical, optical or radiant heat-shielding.

As will be apparent to one skilled in the art, metal ions can be rapidly reduced to the zero-valent state when they encounter electrons of sufficient reducing potential. The position of metal deposition is, therefore, dependent on the experimental variables which determine the fluxes of metal ions and electrons from opposing surfaces of the matrix. The disclosed process relies on control of these counter-directional fluxes. In a preferred mode of operation, the fluxes of reduced transfer agents and metal cations are both maintained constant, i.e., under steady-state conditions, to form an interlayer.

Depending on the experimental conditions and the properties of the electron transfer agent and the metal ions employed, different steady-state conditions can be obtained. For example, raising the concentration of metal ions in solution causes interlayer deposition to occur deeper within the film and closer to the interface with the electron source, whereas increasing the concentration and/or extent of reduction of the reduced transfer agents at the cathode/matrix interface causes deposition to occur closer to the interface with the metal ion source. The concentration of reduced transfer agent will, in turn, be influenced both by the concentration of oxidized transfer agent in the bulk solution and by the potential applied to the cathode. Depending upon this potential and the number of redox states available for the particular transfer agent, either one or more than one electron may be carried by each carrier molecule. Thus, many quinones can function as reducing agents in both mono and dinegative states of reduction. However, in some instances only the dinegative state may be capable of reducing certain metal ions.

EXAMPLES

The PVC was the same for all Examples in which PVC was used.

Adherency Test

The sticky tape test referred to in the following Examples with respect to determination of adherence was applied in the following manner. The tape was pressed tightly on the metal surface and then pulled away. If the metal remained attached to the film, it passed the adhesion test.

Four Point Probe Measurement

The measurement of resistance of the polymer substrate was accomplished using the four-point probe technique of Berry et al., in "Thin Film Technology", Van Nostrand Co., Inc., Princeton, N.J., 1968, pages 1 to 17. In that test, four contacts are made to the film; current is injected across the outer pair of contacts, and the resultant voltage drop across the two remaining points is measured. The sheet resistance ($R_s$) of a layer of thickness $t_{Ag}$ is proportional to the ratio of the voltage (V) to the current (I).

$$R_s = C\frac{(V)}{I} = (\sigma t_{Ag})^{-1}.$$

EXAMPLE 1

An 18% solution of low MW PVC (inherent viscosity 0.65) in tetrahydrofuran (THF) was spin-coated on a clean tin oxide glass plate. After drying in air, a clear transparent film about 30 micrometers ($\mu$m) thick was obtained. The metal deposition was carried out in an apparatus such as that depicted in FIG. 1. The solution contained 0.1M tetramethylammonium hexafluorophosphate (TMAPF$_6$), 0.1M AgBF$_4$ and 0.1M benzoquinone (BQ), dissolved in a 2/1 mixture of acetonitrile (AN) and dimethylformamide (DMF). The deposition area was 1.1 cm$^2$. A constant current of 0.2 mA was used. The applied voltage was $-0.2$ V vs. Ag/Ag$^+$; 0.3 coulomb was deposited. The silver deposited had a mirror quality, adhered strongly to the film, and could not be peeled off by the sticky tape test. The specific conductivity measured by a four-point probe was about $10^6$ $\Omega^{-1}$cm$^{-1}$, very close to the value of silver metal. SEM micrographs showed that the silver was embedded partially in the polymer film and was partially on the surface closest to the cathode. The silver was about 1 $\mu$m thick.

EXAMPLE 2

The procedure of Example 1 was repeated. The BQ concentration was increased to 0.2M and the current applied was 1.0 mA/cm$^2$ and the potential was $-0.8$ V vs. Ag/Ag$^+$. The silver interlayer was 1.3 $\mu$m ($\Delta$l=1.3 $\mu$m) thick and was located 10 $\mu$m from the cathode surface (l=10 $\mu$m). The specific conductivity was $10^5$ $\Omega^{-1}$ cm$^{-1}$.

EXAMPLE 3

The procedure of Example 1 was repeated, only the PVC was coated on a glassy carbon electrode. The solution contained 0.02M AgBF$_4$, 0.1M BQ, and 0.1M TMAPF$_6$ in a 4/1 mixture of acetonitrile and DMF. The deposition was carried out under a constant potential of $-2.2$ V vs. Ag/Ag$^+$. The current was 2.2 to 2.0 mA/cm$^2$; 0.3 coulomb was deposited. The film was 40 $\mu$m thick. The metallic layer was 1.5 $\mu$m thick and very close to the solution surface.

EXAMPLE 4 AND COMPARATIVE EXAMPLE

For demonstration of the effect of the addition of an electroactive transfer agent, two experiments were carried out under identical conditions, except that the Comparative Example did not have an electroactive transfer agent present whereas Example 4 contained 0.1M benzoquinone (BQ) as the electroactive transfer agent. In both cases, a PVC film was used and the solvent was acetonitrile/dimethylformamide (AN/DMF) 4/1 containing 0.01M AgBF$_4$ and 0.1M TMAPF$_6$. All other conditions were as described in Example 1. The electrolyses were carried out at a constant voltage of $-0.8$ V vs. Ag/Ag$^+$. In the Comparative Example, the initial current was 1.1 mA which increased to 4.5 mA; 2 coulombs were deposited. The deposition started from a number of points on the electrode surface and dendritic growth of silver crystals continued into the film. In contrast, no dendrites formed in Example 4 in which the silver interlayer was deposited 5 μm from the cathode surface (l=5 μm).

EXAMPLE 5

Deposition In A Blend Of Polymers

A blend was prepared by dissolving polyvinylidene fluoride and polymethyl methacrylate in a ratio of 4/1 in THF. The solution was spin-coated on conducting glass as in Example 1. Employed was 0.05M naphthaquinone, 0.05M AgNO$_3$, 0.1M TMAPF$_6$ in AN/DMF 2/1 solvent. The voltage (−1.2 V) that was applied gave 0.6 mA/cm$^2$ in steady-state conditions. After 0.3 coulomb was deposited, the reaction was stopped. A silver interlayer was formed in the film.

EXAMPLES 6 TO 9

By the procedure of Example 1, increasing the concentration of the silver salt, when working under the same constant current conditions, results in moving the silver interlayer down from the solution surface toward the cathode surface. The current was 0.5 mA/cm$^2$ and the voltage varied from −0.4 to −1.0 V vs. Ag/Ag$^+$. This is demonstrated in the following Table:

TABLE

| Example | Ag Conc. (M) | L/l/Δl |
| --- | --- | --- |
| 6 | 0.01 | 30/30/2 |
| 7 | 0.02 | 30/6/1.2 |
| 8 | 0.05 | 22/8/1.2 |
| 9 | 0.10 | 13/0/1 | where L is the film thickness, l is the distance of the interlayer from the cathode surface, and Δl is the thickness of the interlayer, in μm. At low silver concentrations, the layer is close to the solution surface; at higher concentrations it is on or near the cathode surface and is highly reflecting. At intermediate concentrations, the interlayers appear in the interior of the film.

EXAMPLES 10 TO 12

Increasing the current increases the rate of flow of the reduced transfer agent from the cathode surface into the PVC film. This has the effect of moving the deposited interlayer away from the cathode surface and into the polymer substrate. In these Examples, the procedure and conditions were as in Example 1, the silver concentration was kept constant at 0.1M while the current was increased from 0.6 to 1.0 mA/cm$^2$. The results are shown in the following Table:

TABLE

| Example | I (mA) | L/l/Δl |
| --- | --- | --- |
| 10 | 0.6 | 25/0.5/1.2 |
| 11 | 0.8 | 25/2.0/1.2 |
| 12 | 1.0 | 18/4.0/1.2 |

EXAMPLES 13 AND 14

When 0.1M Hg(NO$_3$)$_2$ solutions were used, instead of the silver salts, mercury was deposited in the PVC film. In Example 13, the applied current was 0.4 mA/cm$^2$ and the results were L/l/Δl of 15/1.5/1. The sample looked quite reflecting on the solution side. When the current was increased to 0.6 mA/cm$^2$, in Example 14, the results were L/l/Δl of 30/12/2.5.

EXAMPLE 15

Cuprous tetrakis acetonitrile PF$_6$ (0.1M) was used instead of the silver salt. The BQ concentration was 0.1M and the TMAPF$_6$ was 0.2M in AN/DMF 2/1 solution. A constant current of 0.2 mA/cm$^2$ was applied. A metal interlayer was formed in the PVC at L/l/Δl of 20/5/6.

EXAMPLE 16

Polyvinylidene fluoride (PVDF) chips were dissolved in DMF and spin-coated on a tin oxide glass, at 80° C. It was then heated to 114° C. for 10 minutes. A clear 10 μm film was obtained, adhering quite strongly to the glass cathode. The solution used consisted of 0.01M AgBF$_4$, 0.1M BQ and 0.1M TMAPF$_6$, in a 1/5 mixture of AN and DMF. By applying a constant voltage of −0.8 vs. Ag/Ag$^+$ over a film area of 10.2 cm$^2$, a current of 0.35 mA resulted. The silver deposited was L/l/Δl of 12/10/1.5.

EXAMPLE 17

In another experiment, the PVDF was cast on an electrode of glassy carbon. The concentrations used were 0.01M AgBF$_4$, 0.05M BQ and 0.1M TMAPF$_6$ in AN. Electrodeposition was carried out at −0.8 V vs. Ag/Ag$^+$, giving a current of 0.08 mA/cm$^2$. After deposition of 0.3 coulomb, it was stopped. The interlayer was very close to the surface; L/l/Δl of 8/7.5/1.

EXAMPLE 18

A 25 μm film of polyvinyl fluoride was attached to a glass tube. Electrical contact was made by filling the tube with mercury. The other side of the film was dipped into a solution of 0.01M AgBF$_4$, 0.05M BQ and 0.1M TMAPF$_6$ in DMF. The whole assembly was dipped into a thermostat heated to 90° C. Then, −0.8 V vs. Ag/Ag$^+$ were applied giving a current of 0.02 to 0.06 mA, in an area of 0.7 cm$^2$. Deposition was obtained inside the film over a rather wide area: L/l/Δl of 25/10/5.

EXAMPLE 19

Polyvinylfluoride powder was stirred in DMF and cast over a glass plate placed over a hot plate preheated to 110° C. The film, about 100 μm thick, was detached from the glass and attached to a glass tube with the help of a fluoropolymer shrink sleeve. Contact was made with mercury. The solution consisted of 0.01M AgBF$_4$, 0.01M BQ and 0.1M TMAPF$_6$ in DMF. The electrodeposition was carried out at −1.0 V vs. Ag/Ag$^+$. The current was 0.6 mA in a 0.7 cm$^2$ area and 0.3 coulomb was deposited; silver was deposited as an interlayer.

EXAMPLE 20

A dialysis film of regenerated cellulose was tied to a glass tube with a fluoropolymer shrink sleeve. The contact was made with mercury. The solution used was 0.01M AgBF$_4$, 0.01M BQ and 0.1M KNO$_3$ in water. The voltage applied was −0.6 V vs. Ag/Ag$^+$ and the current was 0.08 mA. After 0.2 coulomb was deposited, the electrolysis was stopped. A 0.7 cm$^2$ silver interlayer was formed.

EXAMPLE 21

A dialysis film of regenerated cellulose was swelled in water and placed over a tin oxide glass plate. A glass tube was firmly attached to it with the help of an o-ring and a metal clamp. The glass tube was filled with a solution of 0.1M KNO$_3$, 0.05M Hg(NO$_3$)$_2$ and 0.01M BQ in a 1/1 mixture of water and ethanol. A nitrogen bubbler was used to remove dissolved oxygen and to act as mixer. The auxiliary electrode was a Pt wire and the reference electrode was a Ag wire. A constant potential of −1.8 V vs. Ag/Ag+ was applied resulting in a constant current of 0.7 mA/cm². After deposition of 2 coulombs the reaction was stopped. An interlayer of mercury droplets touching each other could be seen by electron microscopy.

EXAMPLES 22 TO 28

The following Examples show the use of electroactive transfer agents other than benzoquinone. A 20% solution of PVC in THF was coated on a tin oxide glass plate as described in Example 1. The concentration of the silver salt and the reagent are shown in the Table, as well as the potentials and the currents used. In all cases, 0.3 coulomb was deposited.

TABLE

| Ex. No. | Catalyst* | Conc. | AgNO₃ | V (vs. Ag/Ag+) | mA/cm² | L/l/Δl |
|---|---|---|---|---|---|---|
| 22 | NQ | 0.02 | 0.02 | −1.1 | 0.27 | 25/12.5/1.5 |
| 23 | NQ | 0.02 | 0.02 | −1.2 | 0.48 | 25/19/1.5 |
| 24 | NQ | 0.01 | 0.005 | −1.4 | 0.35 | 25/22.6/2 |
| 25 | AQ | 0.05 | 0.05 | −1.5 | 0.5 | 25/11.5/2 |
| 26 | BZ | 0.05 | 0.05 | −1.6 | 0.4 | 25/20/2 |
| 27 | AT | 0.05 | 0.05 | −1.2 | 0.25 | 25/1/2 |
| 28 | FL | 0.05 | 0.05 | −1.8 | 0.52 | 25/23/2 |

*NQ = naphthoquinone, AQ = anthraquinone, BZ = benzil, AT = anthrone, FL = fluorenone.

EXAMPLE 29

Deposition Of Two Layers

The procedure of Example 22 was repeated. The silver nitrate concentration was 0.02M and the NQ was 0.02M. A potential of −1.2 V vs. Ag/Ag+ was first applied. The steady-state current was 0.54 mA/cm². After deposition of 0.3 coulomb, the potential was decreased to −1.1 V and the steady-state current was 0.32 mA/cm²; 0.3 coulomb was deposited at this potential. SEM micrographs showed that two distinctly separate deposits were obtained at l=19 and 12 μm respectively. The same results were also obtained when the first deposition was carried out at −1.1 V, followed by a deposition at −1.2 V vs. Ag/Ag+.

EXAMPLE 30

Deposition From Imaged Cathode

PVC was spin-coated on a chromium on glass commercial photomask having 1 mm lines separated by 1 mm spaces. The silver borofluoride salt concentration used was 0.04M and the BQ was 0.1M. A potential of −0.8 V vs. Ag/Ag+ was applied leading to a steady-state current of 0.2 mA/cm²; 0.15 coulomb was deposited. A clear line pattern was observed. The deposition was 1 μm from the cathode surface and displayed a metal reflectance.

EXAMPLE 31

Deposition From Imaged Test Chart Cathode

PVC was spin-coated on a chromium on glass commercial photomask test chart comprising bars and spaces in a chromium layer where the minimum features are 2.2 μm wide. The silver borofluoride concentration used was 0.05M and the BQ was 0.1M. The potential applied was −1.06 V vs. Ag/Ag+ and the current was 0.8 mA/cm². The deposition was 0.5 coulomb. The original pattern was reproduced as an interlayer of silver particles. The resolution was better than 6 μm.

EXAMPLE 32

Photo-imaging

PVC was spin-coated on an electrode made of hydrogenated Si thin film deposited on top of a tin oxide coated glass. A line pattern mask was placed in front of it and it was illuminated with a projector lamp giving visible light. The solution contained 0.1M BQ and 0.02M AgBF₄. The applied potential was −1.0 V vs. Ag/Ag+, the current was 0.34 mA/cm². The reaction was stopped after deposition of 0.25 coulomb. A line pattern was obtained with conductive layers of silver in exact replica of the projected image.

EXAMPLES 33 TO 35

These Examples illustrate the use of a transfer agent (electrocatalyst) in interlayer deposition in a polymer which is itself electrochemically active. The transfer agent employed in these experiments is N-methyl(-methyl nicotinate) fluoroborate (NMBF₄). Its reduction potential is roughly 0.1 V more positive than that of the polymer (the polyimide derived from 4,4′-oxydianiline and pyromellitic dianhydride, ODA/PMDA).

These experiments were carried out using films of ODA/PMDA coated on conductivized glass as previously described (Example 7 of U.S. Pat. No. 4,512,855). The film area exposed to the solution was 7.07 cm² and the thickness, L is as indicated. The electrolyte solution was 0.10M KPF₆ and 0.01M AgBF₄ dissolved in acetonitrile. In each case, the amount of Ag deposited was sufficient to produce a reflective, electrically conductive interlayer. The applied potential was −1.00 V vs. Ag/Ag+.

| NMBF₄ mole/liter | L μm | I mA/cm² | l/L |
|---|---|---|---|
| 0.00 | 6.94 | 0.035 | 0.038 |
| 0.02 | 6.00 | 0.093 | 0.710 |
| 0.03 | 6.08 | 0.106 | 0.722 |

EXAMPLE 36

This Example, employing a diimide transfer agent, was conducted by the general procedure of Example 1. The PVC film was 30 μm thick. The solvent used was 2/1 AN/DMF containing 0.1M TMAPF₆, 0.02M AgNO₃ and 0.02M di-N-amylpyromellitimide. A potential of −1.2 V vs. Ag/Ag+ was applied and the steady state current was 0.2 mA/cm² in a 1 cm² area. After deposition of 0.3 coulombs, a silver interlayer was obtained.

The embodiments of the invention in which an exclusive property or privilege is claimed are defined as follows:

1. A process for controlled deposition of metal in a matrix, comprising the steps of:
   (i) providing an environment within the matrix for electron transfer by an electron transfer agent,
   (ii) providing the matrix with an electrical circuit source of electrons for transfer within the matrix by the electron transfer agent,
   (iii) contacting the matrix with an electron transfer agent to carry the electrons of step (ii) within the matrix, (iv) contacting the matrix with metal ions reducible to zero-valent metal upon contact with electrons, and (v) reducing the metal ions of step (iv) by contacting them with the electron-carrying electron transfer agent of step (iii).

2. A process according to claim 1 wherein the matrix is a swellable organic polymer, comprising the steps of:

(i) swelling the polymer to provide an environment within the polymer for electron transfer by an electron transfer agent, (ii) providing the swelled polymer with an electrical circuit source of electrons for transfer within the polymer by electron transfer agent, (iii) contacting the swelled polymer with an electron transfer agent to carry the electrons of step (ii) within the polymer, (iv) contacting the swelled polymer with metal ions reducible to zero-valent metal upon contact with electrons, and (v) reducing the metal ions of step (iv) by contacting them with the electron-carrying electron transfer agent of step (iii).

3. A process of claim 2 in which the polymer is selected from at least one member of the group vinyl polymers, polyolefins, polyacrylates, polyesters, polyimides, polysiloxanes, tetrafluoroethylene-containing copolymers, and cellulose.

4. A process according to claim 3 in which the polymer is selected from at least one member of the group polyvinylchloride, polyvinylfluoride, polyvinylidene fluoride and cellulose.

5. A process according to claim 4 in which the electron transfer agent is selected from at least one member of the group quinones, quinone derivatives, imides, and pyridinium salts.

6. A process according to claim 5 in which the electron transfer agent is selected from at least one member of the group benzoquinone, naphthoquinone, anthraquinone, benzil, anthrone, fluorenone, diamyl pyromellitimide and N-methyl(methyl nicotinate) salt.

7. A process according to claim 2 in which the polymer matrix comprises a polymer blend.

8. A process according to claim 7 in which the electron transfer agent is selected from the group benzoquinone, naphthoquinone, anthraquinone, benzil, anthrone, fluorenone, diamyl pyromellitimide and N-methyl(methyl nicotinate) salt.

9. A process according to claim 1 in which the metal is selected from at least one member of the group Ag, Cu, Au, Cd, Hg, Cr, Co, Ni, Pd, Pt, Pb, Sn, Fe, Li, Na, K and Mg.

10. A process according to claim 2 in which the metal is selected from at least one member of the group Ag, Cu, Au, Cd, Hg, Cr, Co, Ni, Pd, Pt, Pb, Sn, Fe, Li, Na, K and Mg.

11. A process according to claim 9 in which the metal is selected from at least one member of the group Ag, Hg, Cu and Ni.

12. A process according to claim 10 in which the metal is selected from at least one member of the group Ag, Hg, Cu and Ni.

13. A process according to claim 1 wherein the metal interlayer extends to the surface of the matrix.

14. A process according to claim 2 wherein the metal interlayer extends to the polymer surface.

15. A process according to claim 2 wherein the thickness of the polymer matrix is about 2 to 100 $\mu$m.

16. A process according to claim 5 wherein the thickness of the polymer matrix is about 2 to 100 $\mu$m.

17. A process according to claim 7 wherein the thickness of the polymer matrix is about 2 to 100 $\mu$m.

18. A process according to claim 15 wherein the thickness of the metal interlayer is about 0.05 to 10 $\mu$m.

* * * * *